United States Patent
Chang et al.

(10) Patent No.: US 6,444,521 B1
(45) Date of Patent: Sep. 3, 2002

(54) METHOD TO IMPROVE NITRIDE FLOATING GATE CHARGE TRAPPING FOR NROM FLASH MEMORY DEVICE

(75) Inventors: Kent Kuo-Hua Chang; Cheng-Chen Calvin Hsueh, both of Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/710,421

(22) Filed: Nov. 9, 2000

(51) Int. Cl.$^7$ .......................................... H01L 21/8247
(52) U.S. Cl. ...................... 438/257; 438/261; 438/263; 438/264
(58) Field of Search ................................ 257/225, 401, 257/411; 438/257, 261, 763, 263, 264; 365/185.28

(56) References Cited

U.S. PATENT DOCUMENTS

| | | | | |
|---|---|---|---|---|
| 5,768,192 A | * | 6/1998 | Eitan ........................... | 365/182 |
| 5,801,076 A | * | 9/1998 | Ghneim et al. .............. | 438/261 |
| 5,805,013 A | * | 9/1998 | Ghneim et al. .............. | 257/411 |
| 5,808,353 A | * | 9/1998 | Fuller et al. ................. | 257/410 |
| 5,811,865 A | * | 9/1998 | Hodges et al. ............... | 257/396 |
| 6,037,639 A | * | 3/2000 | Ahmad ........................ | 257/401 |
| 6,249,460 B1 | * | 6/2001 | Forbes et al. ........... | 365/185.14 |

\* cited by examiner

Primary Examiner—Amir Zarabian
Assistant Examiner—Douglas Menz
(74) Attorney, Agent, or Firm—Powell Goldstein Frazer & Murphy LLP

(57) ABSTRACT

A method to improve nitride floating gate charge trapping for NROM flash memory device is disclosed. The present invention uses the SiON to replace the SiN of the NROM floating gate of the prior art. This arrangement improves the endurance and the reliability of the device and also extends data retention times. The present invention also discloses the integrated processes to fabricate the NROM flash memory device. Using the processes, the steps of fabricating the NROM are efficiently reduced, and the defects caused by the cleaning steps are eliminated.

7 Claims, 1 Drawing Sheet

METHOD TO IMPROVE NITRIDE FLOATING GATE CHARGE TRAPPING FOR NROM FLASH MEMORY DEVICE

FIELD OF THE INVENTION

The present invention relates to a nitride floating gate for NROM flash memory device, and more particularly to the method for the NROM flash memory device having the SiON as the floating gate.

BACKGROUND OF THE INVENTION

Memory devices for non-volatile storage of information are currently in widespread use today, being used in a myriad of applications. A few examples of non-volatile semiconductor memory include programmable read only memory (PROM), erasable programmable read only memory (EPROM), electrically erasable programmable read only memory (EEPROM), and flash EEROM.

The Semiconductor ROM device, however, suffers from the disadvantage of not being a electrically programmable memory device. The programming of a ROM occurs during one of the manufacturing steps using special masks containing the data to be stored. Thus, the entire contents of a ROM must be determined before manufacture. Furthermore, the penalty is the inability to change the data once the masks are committed. If mistakes in the data programming are found they are typically very costly to correct. Any inventory that exists having incorrect data programming is instantly obsolete and probably cannot be used.

The EPROM semiconductor devices eliminate the necessity of mask programming the data. An advantage of EPROMs is that they are electrically programmed, but for erasing. The EPROMs require exposure to ultraviolet (UV) light. These devices are constructed with windows transparent to UV light to allow the die to be exposed for erasing, which must be performed before the devices can be programmed. A major drawback to these devices is that they lack the ability to be electrically erased. In many circuit designs it is desirable to have a non-volatile memory device that can be erased and reprogrammed in-circuit, without the need to remove the device for erasing and reprogramming.

The EEPROM semiconductor devices eliminate the disadvantages described above, and they can be erased and reprogrammed in-circuit. Thus, the widespread use of EEPROM semiconductor memory has prompted much research focusing on improving current technology. Active areas of research have focused on developing an EEPROM memory cell that has improved performance characteristics such as shorter programming times, utilizing lower voltages for programming and reading, longer data retention times and smaller physical dimensions.

Referring to FIG. 1, a profile shows an EEPROM cell of the prior art. The cell 30 comprises a P-type substrate 26, two $N^+$ junctions 22, 24, a floating gate 14 sandwiched between two oxide layers 12, 16, and a control gate 18 on the top of the cell 30. The floating gate and the control gate of EEPROM cell in the prior art are polysilicon of conductible.

When the different voltages are applied to the control gate 18, and two $N^+$ junctions 22, 24, the hot electrons are injected to the floating gate 14, and remain stored there. According to this method, one cell is programmed.

The floating gate 14 of the EEPROM in the prior art is polysilicon, so that the charges that get injected into the floating gate 14 are distributed equally across the entire floating gate. The threshold of the entire floating gate 14 starts to increase as more and more charges are injected into the floating gate 14. The threshold voltage increases because the electrons that become stored in the gate screen the gate voltage from the channel. Thus, an increase in the gate threshold voltage causes the current flowing through the channel to decrease. This reduces programming efficiency by lengthening the programming time.

U.S. Pat. No. 5,768,192, issued to Boaz Eitan, teaches a non-volatile semiconductor memory cell utilizing asymmetrical charge trapping. The structure of the memory cell is similar to the EEPROM in the prior art, but the floating gate is replaced by SiN (silicon nitride). An ONO (oxide-nitride oxide) is formed above the channel area, that as NROM (nitride ROM). The nonconducting SiN layer can trap the hot electrons, and the trapped electrons cannot spread through the SiN layer because of the low conductivity of the SiN layer. Because of the asymmetrical distribution, the NROM is programmed and read asymmetrically. This means that programming and reading occur in opposite directions of the two $N^+$ junctions. But, the charge trapping of SiN film floating gate is not so efficiency for hot electrons and the charge distribution is wider. The disadvantages above will affect the characters of the NROM and cause the problems in programming and erasing.

Also, the conventional batch progresses are more complex. For example, the first oxide layer (tunnel oxide) is produced by heating in a furnace with high thermal temperatures of 900~1050° C., then LPCVD SiN is deposited in the furance at 800° C., is cleaned, then a high thermal budget is used to grow oxide layer top of the SiN layer by 950° C. wet thermal oxidation, then is RCA cleaned before LPCVD doped polysilicon.

Due to the complex batch process, some defects like wafer damage by misprocesses occur and, more particles are generated during the clean-up step. Furthermore, longer process queue time and more process bottlenecks cause more process cycle time and less product output.

SUMMARY OF THE INVENTION

It is therefore an objective of this invention to provide a method to improve nitride floating gate charge trapping for NROM flash memory device. The present invention uses the SiON to replace the SiN of the NROM floating gate in the prior art. So that, the endurance and the reliability of the device are improved, and the data retention times are also extended.

It is another objective of this invention to provide an integrated process to fabricate the NROM flash memory device. Using the process, the steps of fabricating the NROM are reduced efficiently, and the defects caused by the clean steps are eliminated.

In accordance with the foregoing and other objects of this invention, a NROM flash memory is provided. A P type semiconductor substrate comprises a first $N^+$ doped region and a second $N^+$ doped region, a channel being formed in the space between the first $N^+$ doped region and the second $N^+$ doped region within the P type semiconductor substrate. A first oxide layer is overlaid and covers the channel portion of the P type semiconductor substrate. A SiON layer is formed on and overlays the first oxide layer. A second oxide layer is formed on and overlaid the SiON layer. A polysilicon layer is formed on and overlays the second oxide layer.

In accordance with the foregoing and other objects of this invention, this invention provides a SiON layer as a floating gate of the NROM flash memory.

In accordance with the foregoing and other objects of this invention, this invention provides a method using an integrated process to fabricate the NROM flash memory, comprising the following steps: providing a single wafer thermal consecutive process system to a semiconductor substrate; using a APCVD to form a first oxide layer on and overlaying said semiconductor substrate; using a PECVD to form a SiON layer on and overlaying said first oxide layer; using a LPCVD to form a second oxide layer on and overlying said SiON layer; and using a LPCVD to form a polysilicon layer on and overlying said second oxide layer.

BRIEF DESCRIPTIONS OF THE DRAWINGS

The invention will be more fully understood from the detailed description given herein below and the accompanying drawing, which are given by way of illustration only, and thus do not limit the present invention, and wherein.

DETAILED DESCRIPTIONS OF THE INVENTION

Figure 1:
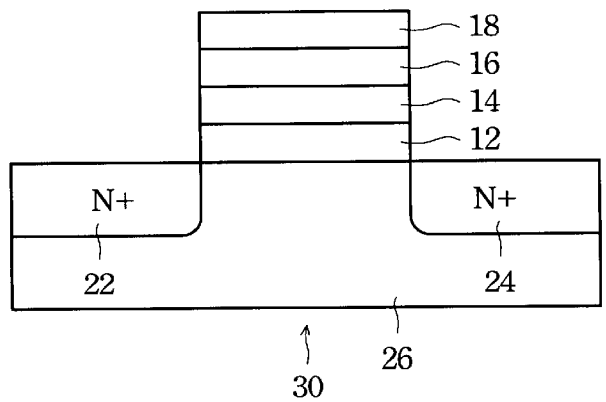
FIG. 1 illustrates a profile of the electrically erasable programmable read only memory (EEPROM) of the prior art.

Reference will now be made in detail to the present preferred embodiments of the invention, examples of which are illustrated in the accompanying drawings. Wherever possible, the same reference numbers are used in the drawings and the description to refer to the same or like parts.

Figure 2:
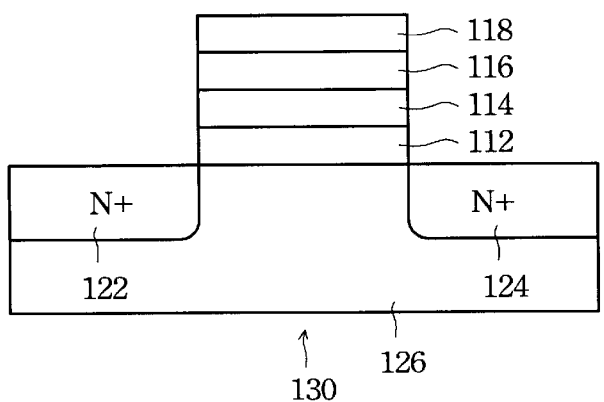
FIG. 2 illustrates a profile of a NROM flash memory cell of the present invention.

Referring to FIG. 2, a profile shows a NROM fresh memory cell of the present invention. The NROM fresh memory cell 30 comprises a P-type substrate 126, two $N^+$ junctions 122, 124, a floating gate 114 sandwiched between two oxide layers 112, 116, and a control gate 118 on the top of the NROM fresh memory cell 130. The difference between the present invention and the prior art is that the NROM of the present invention uses the SiON as the floating gate, the NROM of the prior art uses the SiN as the floating gate, and the EEPROM uses the polysilicon as the floating gate.

Because the charge trapping of the SiN film floating gate is not to efficient for hot electrons and the charge distribution is wider, the present invention provides a SiON film as the floating gate to overcome the shortcoming of the NROM in the prior art. The SiON film has better charge trapping efficiency than the SiN film. Thus, more hot electrons are trapped in the SiON film than the SiN film. Also, the SiON has charge trapping efficiency with narrow charge (localized) distribution. This improves the retention and the characters of the NROM device, and the problems in programming and erasing are solved.

Figure 3:
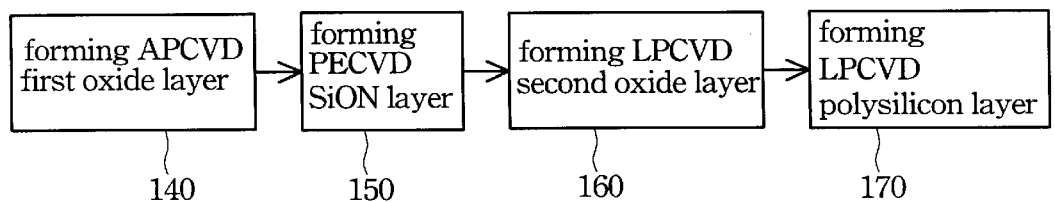
FIG. 3 shows the process steps to fabricate the NROM flash memory device of the present invention.

For solving the complex batch processes, the present invention provides an integrated process to fabricate the NROM flash memory device. The process integrates the steps of growing first oxide (tunnel oxide) layer, SiON floating gate, second oxide layer, and polysilicon control gate in a single wafer thermal consecutive process system. The process steps to fabricate the NROM flash memory device of the present invention are shown in FIG. 3.

First, the single wafer thermal consecutive process system is used to form APCVD oxide for first oxide (tunnel oxide) layer 140, and then PECVD SiON layer 150 for the floating gate, and then the LPCVD oxide layer for second oxide layer 160, and then the LPCVD in-situ doped polysilicon 170 for the control gate. The conditions for growing these layers are described as follows.

Growing the first oxide (tunnel oxide) layer step:
  APCVD
  Process temperature: 400–1200° C.
  Process gas: $H_2$, $O_2$, $N_2O$
  Process pressure: 5–25 torr
Growing the SiON layer step:
  PECVD
  Process temperature: 350–550° C.
  Process gas (flow control): $SiH_4$ (90–110 sccm), $N_2O$ (35–45 sccm), $N_2$ (450–550 sccm)
  Process pressure: 3 m–10 m torr
  Power: 300–400 W
Growing the second oxide layer step:
  LPCVD
  Process temperature: 650–750° C.
  Process gas: $SiH_4$, $N_2O$
  Process pressure: 200–400 torr
Growing the polysilicon layer step:
  LPCVD
  Process temperature: 550–800° C.
  Process gas: $SiH_4$, $PH_3$
  Process pressure: 200–400 torr Thus, using the integrated process to fabricate the NROM flash memory device, the endurance and the reliability of the device are improved, and the defects arising under the clean steps are eliminated.

It is therefore an advantage of this invention to provide a method to improve nitride floating gate charge trapping for the NROM flash memory device. The present invention uses the SiON to replace the SiN of the NROM floating gate in the prior art. Accordingly, the endurance and the reliability of the device are improved, and the data retention times are also extended.

It is another advantage of this invention to provide an integrated process to fabricate the NROM flash memory device. Using the process, the steps of fabricating the NROM are efficiently reduced, and the defects caused by the cleaning steps are eliminated.

While the preferred embodiment of the invention has been illustrated and described, it will be appreciated that various changes can be made therein without departing from the spirit and scope of the invention.

What is claimed is:

1. A method using an integrated process to fabricate the NROM flash memory device, comprising the steps of:
  providing a single wafer thermal consecutive process system to a semiconductor substrate;
  using a APCVD to form a first oxide layer on and overlaying said semiconductor substrate;
  using a PECVD to form a SiON layer on and overlaying said first oxide layer;
  using a LPCVD to form a second oxide layer on and overlying said SiON layer; and
  using a LPCVD to form a polysilicon layer on and overlying said second oxide layer.

2. The method according to claim 1, wherein said semiconductor substrate is a P type semiconductor substrate comprising a first $N^+$ doped region and a second $N^+$ doped region, a channel being formed in the space between said first $N^+$ doped region and said second $N^+$ doped region within said P type semiconductor substrate.

3. The method according to claim 1, wherein said step of using a APCVD to form a first oxide layer comprises the conditions of a process temperature of about between 400° C. and 1200° C., a Process pressure of about 5 torr and 25 torr, and a plurality of process gases include a $H_2$, a $O_2$, and a $NO_2$.

4. The method according to claim 1, wherein said step of using a PECVD to form a SiON comprises the conditions of a process temperature of about between 350° C. and 550° C., a process pressure of about 3 m torr and 10 m torr, a power about between 300 W and 400 W, and a plurality of process gases include a $SiH_4$, a $N_2O$, and a $N_2$.

5. The method according to claim 3, wherein a plurality of flow controls of the said process gases are said $SiH_4$ of about between 90 sccm and 110 sccm, said $N_2O$ of about between 35 sccm and 45 sccm, said the $N_2$ of about between 450 sccm and 550 sccm.

6. The method according to claim 1, wherein said step of using a LPCVD to form a second oxide layer comprises the conditions of a process temperature of about 650° C. and 750° C., a process pressure of about 200 torr and 400 torr, and a plurality of process gases include a $SiH_4$, a $N_2O$.

7. The method according to claim 1, wherein said step of using a LPCVD to form a polysilicon layer comprises the conditions of a process temperature of about 500° C. and 800° C., a process pressure of about 200 torr and 400 torr, and a plurality of process gases include a $SiH_4$, a $PH_3$.

* * * * *